(12) United States Patent
Kayser et al.

(10) Patent No.: US 9,064,074 B2
(45) Date of Patent: Jun. 23, 2015

(54) RETRIEVING ODD NET TOPOLOGY IN HIERARCHICAL CIRCUIT DESIGNS

(75) Inventors: Joerg Kayser, Waldenbuch (DE); Helmut Kohler, Moensheim (DE); Norbert Schumacher, Forchtenberg (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 782 days.

(21) Appl. No.: 13/295,489

(22) Filed: Nov. 14, 2011

(65) Prior Publication Data

US 2013/0124182 A1 May 16, 2013

(51) Int. Cl.
*G06F 17/50* (2006.01)

(52) U.S. Cl.
CPC ........ *G06F 17/5045* (2013.01); *G06F 17/5081* (2013.01)

(58) Field of Classification Search
None
See application file for complete search history.

(56) References Cited

U.S. PATENT DOCUMENTS

| | | | | |
|---|---|---|---|---|
| 5,487,074 A * | 1/1996 | Sullivan | ........................ | 714/727 |
| 6,516,456 B1 * | 2/2003 | Garnett et al. | ................ | 716/119 |
| 7,080,333 B1 | 7/2006 | Ratchev et al. | | |
| 7,188,284 B2 * | 3/2007 | Mitra et al. | .................... | 714/726 |
| 7,292,970 B1 * | 11/2007 | Hurlock | ......................... | 703/23 |
| 7,506,286 B2 | 3/2009 | Beardslee et al. | | |
| 8,020,057 B2 * | 9/2011 | Whetsel | ........................ | 714/726 |
| 8,341,473 B2 * | 12/2012 | Bertacco et al. | ............. | 714/726 |
| 8,601,333 B2 * | 12/2013 | Van Den Eijnden | .......... | 714/727 |
| 2008/0077893 A1 * | 3/2008 | Korson et al. | ..................... | 716/5 |
| 2010/0146338 A1 | 6/2010 | Schalick et al. | | |

OTHER PUBLICATIONS

Guohun Zhu; Xuelong Yan; Ya Zhou; Yueren Guo, "The algorithms of inserting boundary-scan circuit automatically," Solid-State and Integrated Circuit Technology, 1998. Proceedings. 1998 5th International Conference on , vol., No., pp. 527,531, 1998.*

* cited by examiner

*Primary Examiner* — Omar Fernandez Rivas
*Assistant Examiner* — Robert Brock
(74) *Attorney, Agent, or Firm* — James L. Baudino

(57) ABSTRACT

According to one aspect of the present disclosure, a method and technique for identifying odd nets in a hierarchical electronic circuit design is disclosed. The method includes: receiving a very high-speed integrated circuit hardware description language (VHDL) model of an electronic circuit design; modifying an architecture section of VHDL code of each endpoint component of the VHDL model to connect each input/output (IO) of the endpoint component VHDL code to an instance of a snoop VHDL code; executing a simulation of the VHDL model through a plurality of clock cycles while driving a logical value by the snoop VHDL code and deriving simulation clashes detected by the snoop VHDL code for each IO of the endpoint components; and extracting an odd net topology for the VHDL model based on the simulation clashes derived from the simulation.

19 Claims, 7 Drawing Sheets

```
entity snoop is
  port
  (
      ANY : inout   STD_LOGIC
  );
end entity;

architecture snoop of snoop is

SIGNAL CCC   : STD_LOGIC := '1';
  SIGNAL SET   : STD_LOGIC := '0';
  SIGNAL GET   : STD_LOGIC ;

begin

--> Facility to be set/sticked
  Latch_Out_Behavior:
  process(CCC) begin
    SET  <= '1';
  end process;

--> Facilitiy to be expected/traced
  Latch_IN_Behavior:
  process(CCC) begin
    GET  <= ANY;
  end process;

ANY <= SET;

end architecture;
```

FIG. 5

```
entity ep_zchip_snoop is
port (
    :
    p_c4_cp_pp_sc1_clk3_clock_n   : inout std_logic;
    p_c4_cp_pp_sc1_clk3_clock_p   : inout std_logic;
    p_c4_cp_pp_sc1_clk3_dat       : inout std_logic_vector(0 to 15);
    :
);
end ep_zchip_snoop;

architecture ep_zchip_snoop of ep_zchip_snoop is component snoop
    port ( any : inout std_logic );
    end component;

begin
    :
    ßß_p_c4_cp_pp_sc0_clk3_clock_n : snoop   port map ( any => p_c4_cp_pp_sc0_clk3_clock_n );
    ßß_p_c4_cp_pp_sc0_clk3_clock_p : snoop   port map ( any => p_c4_cp_pp_sc0_clk3_clock_p );
    ßß_p_c4_cp_pp_sc0_clk3_dat_0  :  snoop   port map ( any => p_c4_cp_pp_sc0_clk3_dat(0) );
    ßß_p_c4_cp_pp_sc0_clk3_dat_1  :    snoop port map ( any => p_c4_cp_pp_sc0_clk3_dat(1) );
    ßß_p_c4_cp_pp_sc0_clk3_dat_2  :    snoop port map ( any => p_c4_cp_pp_sc0_clk3_dat(2) );
    ßß_p_c4_cp_pp_sc0_clk3_dat_3  :    snoop port map ( any => p_c4_cp_pp_sc0_clk3_dat(3) );
    ßß_p_c4_cp_pp_sc0_clk3_dat_4  :    snoop port map ( any => p_c4_cp_pp_sc0_clk3_dat(4) );
    ßß_p_c4_cp_pp_sc0_clk3_dat_5  :    snoop port map ( any => p_c4_cp_pp_sc0_clk3_dat(5) );
    ßß_p_c4_cp_pp_sc0_clk3_dat_6  :    snoop port map ( any => p_c4_cp_pp_sc0_clk3_dat(6) );
    ßß_p_c4_cp_pp_sc0_clk3_dat_7  :    snoop port map ( any => p_c4_cp_pp_sc0_clk3_dat(7) );
    ßß_p_c4_cp_pp_sc0_clk3_dat_8  :    snoop port map ( any => p_c4_cp_pp_sc0_clk3_dat(8) );
    ßß_p_c4_cp_pp_sc0_clk3_dat_9  :    snoop port map ( any => p_c4_cp_pp_sc0_clk3_dat(9) );
    ßß_p_c4_cp_pp_sc0_clk3_dat_10 : snoop    port map ( any => p_c4_cp_pp_sc0_clk3_dat(10) );
    ßß_p_c4_cp_pp_sc0_clk3_dat_11 : snoop    port map ( any => p_c4_cp_pp_sc0_clk3_dat(11) );
    ßß_p_c4_cp_pp_sc0_clk3_dat_12 : snoop    port map ( any => p_c4_cp_pp_sc0_clk3_dat(12) );
    ßß_p_c4_cp_pp_sc0_clk3_dat_13 : snoop    port map ( any => p_c4_cp_pp_sc0_clk3_dat(13) );
    ßß_p_c4_cp_pp_sc0_clk3_dat_14 : snoop    port map ( any => p_c4_cp_pp_sc0_clk3_dat(14) );
    ßß_p_c4_cp_pp_sc0_clk3_dat_15 : snoop    port map ( any => p_c4_cp_pp_sc0_clk3_dat(15) );
    :
end architecture;
```

FIG. 6

| stick | CP2.CP.ßß_P_C4_CP_PP_SC0_CLK3_CLOCK_N.SET | 0 |
|---|---|---|
| clock | 1 | |
| batch | tc/expect | |
| unstick | CP2.CP.ßß_P_C4_CP_PP_SC0_CLK3_CLOCK_N.SET | |
| clock | 1 | |

| stick | CP2.CP.ßß_P_C4_CP_PP_SC0_CLK3_CLOCK_P.SET | 0 |
|---|---|---|
| clock | 1 | |
| batch | tc/expect | |
| unstick | CP2.CP.ßß_P_C4_CP_PP_SC0_CLK3_CLOCK_P.SET | |
| clock | 1 | |

| stick | CP2.CP.ßß_P_C4_CP_PP_SC0_CLK3_DAT_0.SET | 0 |
|---|---|---|
| clock | 1 | |
| batch | tc/expect | |
| unstick | CP2.CP.ßß_P_C4_CP_PP_SC0_CLK3_DAT_0.SET | |
| clock | 1 | |

FIG. 7

RETRIEVING ODD NET TOPOLOGY IN HIERARCHICAL CIRCUIT DESIGNS

BACKGROUND

Electronic circuit packages or designs are often composed of a variety of components delivered and/or provided by different sources. For example, the electronic circuit design may include boards/backplanes, cards, multi-chip modules, chips, etc., plugged into each other. The various physical components of the package are connected to each other via connectors, wires, solder lines, etc. During the design process for the electronic circuit package, a simulation process may be performed to enable designers to simulate the design using software tools, thereby testing the function of the design before its actual build. Part of the simulation process is to ensure the various components of the design are correctly connected.

BRIEF SUMMARY

According to one aspect of the present disclosure a method and technique for identifying odd nets in a hierarchical electronic circuit design is disclosed. The method includes: receiving a very high-speed integrated circuit hardware description language (VHDL) model of an electronic circuit design; modifying an architecture section of VHDL code of each endpoint component of the VHDL model to connect each input/output (IO) of the endpoint component VHDL code to an instance of a snoop VHDL code; executing a simulation of the VHDL model through a plurality of clock cycles while driving a logical value by the snoop VHDL code and deriving simulation clashes detected by the snoop VHDL code for each IO of the endpoint components; and extracting an odd net topology for the VHDL model based on the simulation clashes derived from the simulation.

BRIEF DESCRIPTION OF THE SEVERAL VIEWS OF THE DRAWINGS

For a more complete understanding of the present application, the objects and advantages thereof, reference is now made to the following descriptions taken in conjunction with the accompanying drawings, in which:

FIG. 5 is a diagram illustrating an embodiment of exemplary software code description for a snoop element of the present disclosure;

FIG. 6 is a diagram illustrating an embodiment of an exemplary software code description of a modified hardware description language representation of a component utilizing a snoop element of the present disclosure;

FIG. 7 is a diagram illustrating an embodiment of an exemplary software code description of a series of net simulation cycles performed according to the present disclosure.

DETAILED DESCRIPTION

Figure 1:
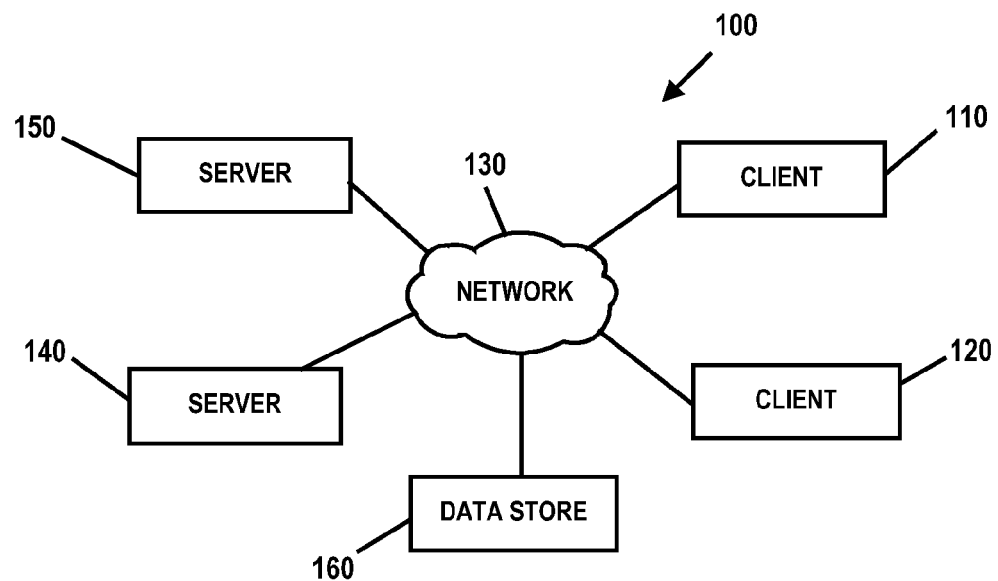
FIG. 1 is an embodiment of a network of data processing systems in which the illustrative embodiments of the present disclosure may be implemented.

Embodiments of the present disclosure provide a method, system and computer program product for identifying odd nets in a hierarchical electronic circuit design. For example, in some embodiments, the method and technique includes: receiving a very high-speed integrated circuit hardware description language (VHDL) model of an electronic circuit design; modifying an architecture section of VHDL code of each endpoint component of the VHDL model to connect each input/output (IO) of the endpoint component VHDL code to an instance of a snoop VHDL code; executing a simulation of the VHDL model through a plurality of clock cycles while driving a logical value by the snoop VHDL code and deriving simulation clashes detected by the snoop VHDL code for each IO of the endpoint components; and extracting an odd net topology for the VHDL model based on the simulation clashes derived from the simulation. Thus, in some embodiments of the present disclosure, a simulation of an electronic circuit design over multiple package levels may be performed to identify odd or incorrect/potentially incorrect nets (or connections) between design components by evaluating simulation clashes. Embodiments of the present disclosure utilize a watchdog or snoop latch to drive one value and sense another value to identify a signal clash to establish a netlist for the design over multiple package levels.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer usable or computer readable medium(s) may be utilized. The computer readable medium may be a computer readable signal medium or a computer readable storage medium. A computer readable storage medium may be, for example but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 2:
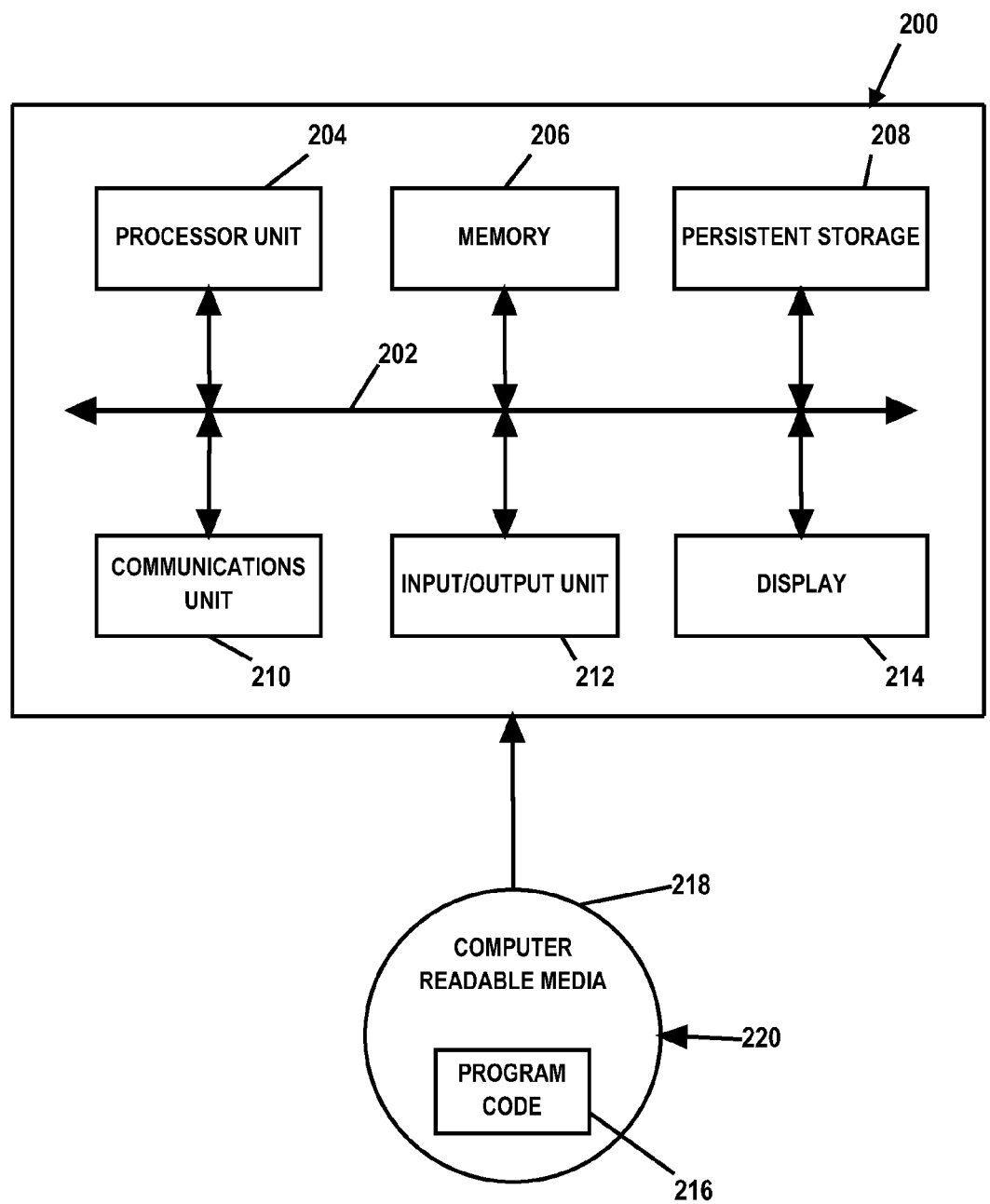
FIG. 2 is an embodiment of a data processing system in which the illustrative embodiments of the present disclosure may be implemented.

With reference now to the Figures and in particular with reference to FIGS. 1-2, exemplary diagrams of data processing environments are provided in which illustrative embodiments of the present disclosure may be implemented. It should be appreciated that FIGS. 1-2 are only exemplary and are not intended to assert or imply any limitation with regard to the environments in which different embodiments may be implemented. Many modifications to the depicted environments may be made.

FIG. 1 is a pictorial representation of a network of data processing systems in which illustrative embodiments of the present disclosure may be implemented. Network data processing system 100 is a network of computers in which the illustrative embodiments of the present disclosure may be implemented. Network data processing system 100 contains network 130, which is the medium used to provide communications links between various devices and computers connected together within network data processing system 100. Network 130 may include connections, such as wire, wireless communication links, or fiber optic cables.

In some embodiments, server 140 and server 150 connect to network 130 along with data store 160. Server 140 and server 150 may be, for example, IBM System P® servers. In addition, clients 110 and 120 connect to network 130. Clients 110 and 120 may be, for example, personal computers or network computers. In the depicted example, server 140 provides data and/or services such as, but not limited to, data files, operating system images, and applications to clients 110 and 120. Network data processing system 100 may include additional servers, clients, and other devices.

In the depicted example, network data processing system 100 is the Internet with network 130 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, network data processing system 100 also may be implemented as a number of different types of networks, such as for example, an intranet, a local area network (LAN), or a wide area network (WAN). FIG. 1 is intended as an example, and not as an architectural limitation for the different illustrative embodiments.

FIG. 2 is an embodiment of a data processing system 200 such as, but not limited to, client 110 and/or server 140 in which an embodiment of a system for identifying odd nets in a hierarchical electronic circuit design according to the present disclosure may be implemented. In this embodiment, data processing system 200 includes a bus or communications fabric 202, which provides communications between processor unit 204, memory 206, persistent storage 208, communications unit 210, input/output (I/O) unit 212, and display 214.

Processor unit 204 serves to execute instructions for software that may be loaded into memory 206. Processor unit 204 may be a set of one or more processors or may be a multi-processor core, depending on the particular implementation. Further, processor unit 204 may be implemented using one or more heterogeneous processor systems in which a main processor is present with secondary processors on a single chip. As another illustrative example, processor unit 204 may be a symmetric multi-processor system containing multiple processors of the same type.

In some embodiments, memory 206 may be a random access memory or any other suitable volatile or non-volatile storage device. Persistent storage 208 may take various forms depending on the particular implementation. For example, persistent storage 208 may contain one or more components or devices. Persistent storage 208 may be a hard drive, a flash memory, a rewritable optical disk, a rewritable magnetic tape, or some combination of the above. The media used by persistent storage 208 also may be removable such as, but not limited to, a removable hard drive.

Communications unit 210 provides for communications with other data processing systems or devices. In these examples, communications unit 210 is a network interface card. Modems, cable modem and Ethernet cards are just a few of the currently available types of network interface adapters. Communications unit 210 may provide communications through the use of either or both physical and wireless communications links.

Input/output unit 212 enables input and output of data with other devices that may be connected to data processing system 200. In some embodiments, input/output unit 212 may provide a connection for user input through a keyboard and mouse. Further, input/output unit 212 may send output to a printer. Display 214 provides a mechanism to display information to a user.

Instructions for the operating system and applications or programs are located on persistent storage 208. These instructions may be loaded into memory 206 for execution by processor unit 204. The processes of the different embodiments may be performed by processor unit 204 using computer implemented instructions, which may be located in a memory, such as memory 206. These instructions are referred to as program code, computer usable program code, or computer readable program code that may be read and executed by a processor in processor unit 204. The program code in the different embodiments may be embodied on different physical or tangible computer readable media, such as memory 206 or persistent storage 208.

Program code 216 is located in a functional form on computer readable media 218 that is selectively removable and may be loaded onto or transferred to data processing system 200 for execution by processor unit 204. Program code 216 and computer readable media 218 form computer program product 220 in these examples. In one example, computer readable media 218 may be in a tangible form, such as, for example, an optical or magnetic disc that is inserted or placed into a drive or other device that is part of persistent storage 208 for transfer onto a storage device, such as a hard drive that is part of persistent storage 208. In a tangible form, computer readable media 218 also may take the form of a persistent storage, such as a hard drive, a thumb drive, or a flash memory that is connected to data processing system 200. The tangible form of computer readable media 218 is also referred to as computer recordable storage media. In some instances, computer readable media 218 may not be removable.

Alternatively, program code 216 may be transferred to data processing system 200 from computer readable media 218 through a communications link to communications unit 210 and/or through a connection to input/output unit 212. The communications link and/or the connection may be physical or wireless in the illustrative examples.

The different components illustrated for data processing system 200 are not meant to provide architectural limitations to the manner in which different embodiments may be implemented. The different illustrative embodiments may be implemented in a data processing system including components in addition to or in place of those illustrated for data processing system 200. Other components shown in FIG. 2 can be varied from the illustrative examples shown. For example, a storage device in data processing system 200 is any hardware apparatus that may store data. Memory 206, persistent storage 208, and computer readable media 218 are examples of storage devices in a tangible form.

Figure 3:
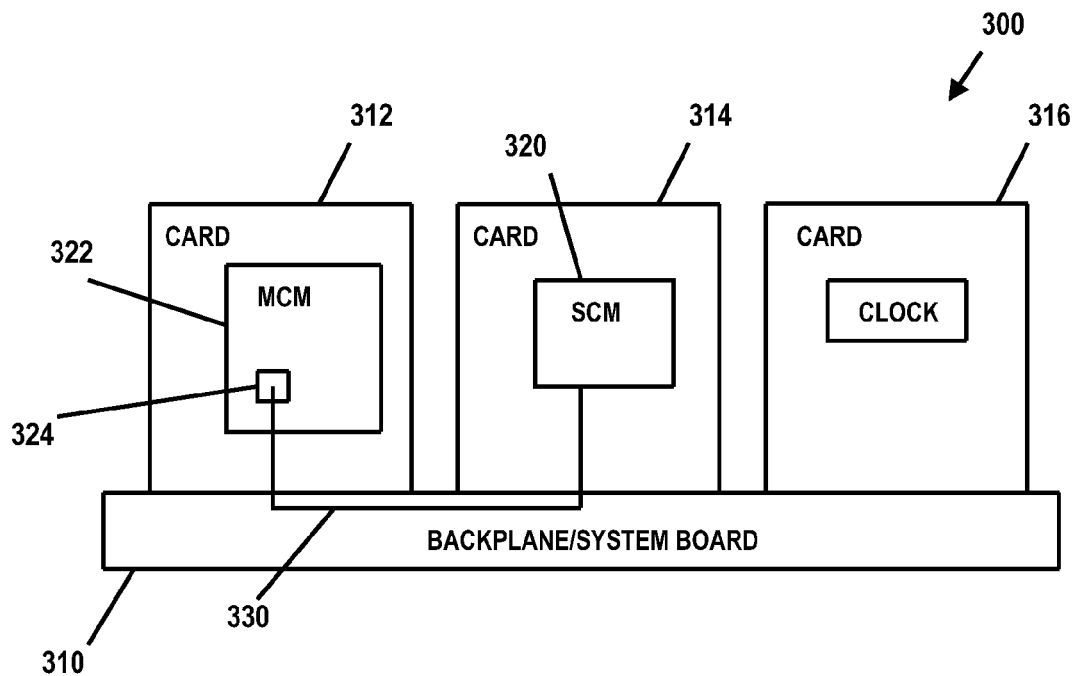
FIG. 3 is a diagram illustrating an embodiment of a hierarchical electronic circuit design in which embodiments of the present disclosure may be utilized to identify an odd net topology.

FIG. 3 is a diagram illustrating an embodiment of a hierarchical electronic circuit design 300 in which embodiments of the present disclosure may be used to identify odd nets in the design 300. Odd nets comprise incorrect or potentially incorrect connections between components of the electronic circuit design package. In FIG. 3, design 300 includes various levels of electronic circuit components connected to each other via "nets" (e.g., connectors, wires, solder lines, etc.). In FIG. 3, design 300 includes a system board or backplane 310 having three cards 312, 314 and 316 connected thereto. It should be understood that cards 312, 314 and 316 may comprise any type of electronic circuit card. For example, card 316 may comprise a clock circuit for driving a clock signal according to a programming or machine cycle. In FIG. 3, card 314 includes a single chip microprocessor (SCM) 320 connected thereto, and card 312 includes a multi-chip module (MCM) 322 connected thereto and having an integrated circuit or chip 324 connected thereto. It should be understood that design 300 may include other varied types of components.

As illustrated in FIG. 3, design 300 includes multiple "levels" of components in a hierarchical arrangement. For example, backplane 310 may represent a first level of design 300, cards 312, 314 and 316 may be considered at a second level of design 300, SCM 320 and MCM 322 may be considered at a third level of design 300, and chip 324 may be considered at a fourth level of design 300. It should be understood that design 300 may include a greater or fewer number of levels, and may include various types and/or quantities of components at each level. In FIG. 3, a net 330 is illustrated. Net 330 extends across or through different levels of design 300. For example, in this example, net 330 extends from chip 324, to MCM 322, to card 312, to backplane 310, to card 314, and to SCM 320. It should be understood that design 300 may include many nets extending between various components of design 300 and extending through various levels of design 300. In the embodiment illustrated in FIG. 3, net 330 includes two endpoint components, chip 324 and SCM 320, such that endpoint components represent an endpoint of a particular net (e.g., no further wiring or connections extend beyond the endpoint component). In hierarchical designs such as design 300, during the design process, there exists a probability that incorrect connections or nets are created which may not be found or located. Embodiments of the present disclosure provide a method and technique for identifying and/or extracting incorrect or odd nets from the design.

Figure 4:
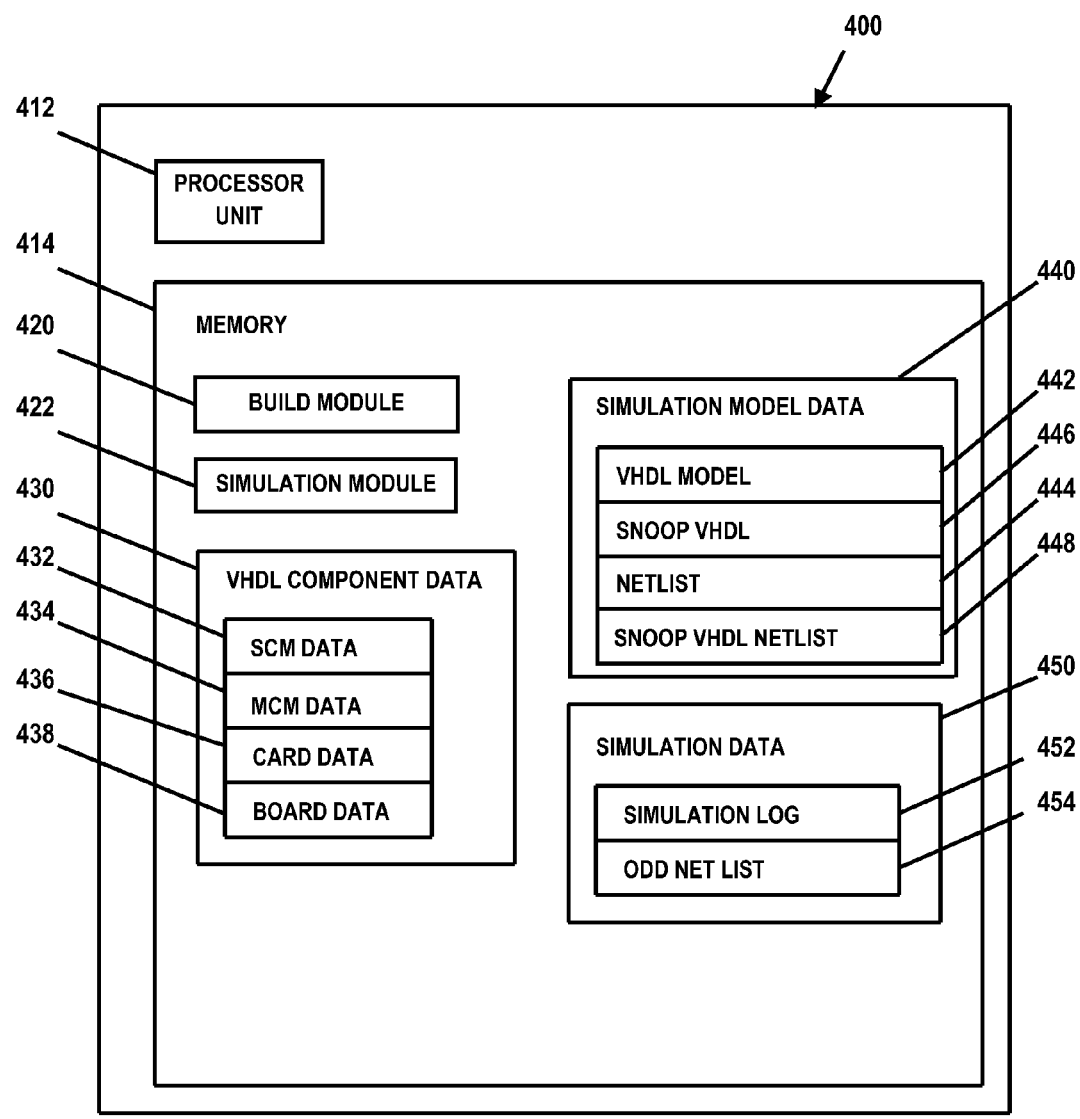
FIG. 4 is a diagram illustrating an embodiment of data processing system for identifying odd nets in a hierarchical electronic circuit design in which illustrative embodiments of the present disclosure may be implemented.

FIG. 4 is an illustrative embodiment of a system 400 for identifying odd nets in a hierarchical electronic circuit design, such as design 300. System 400 may be implemented on data processing systems or platforms such as, but not limited to, servers 140 and/or 150, clients 110 and/or 120, or at other data processing system locations. In the embodiment illustrated in FIG. 4, system 400 comprises one or more processor units or processors 412 coupled to a memory 414. In the embodiment illustrated in FIG. 4, memory comprises a build module 420 and a simulation module 422. Build module 420 and simulation module 422 may be implemented in any suitable manner that may be hardware-based, software-based, or some combination of both. For example, build module 420 and simulation module 422 may comprise software, logic and/or executable code for performing various functions as described herein (e.g., residing as software and/or an algorithm running on a processor unit, hardware logic residing in a processor or other type of logic chip, centralized in a single integrated circuit or distributed among different chips in a data processing system).

Build module 420 is used to design and/or represent an electronic circuit design, such as design 300, in very high-speed integrated circuit hardware description language (VHDL). For example, in FIG. 3, memory 414 includes VHDL component data 430 containing VHDL representations of the various components that may be included in a circuit design. For example, components such as boards, cards, modules and chips are designed with regard to their physical attributes. Each board or card uses connectors to house the next component. The connections in a system/design are referred to by a physical pin and a logical netname. The assignment between physical and logical attributes is done during the card/board design. The hardware is connected by physical pins, while a simulation model uses the logical netnames. A sample netname is:

DPIN          CP01_CTP_SEEPROM0_CLK         B PHYPIN=AR044

The packaging data of each physical component in the circuit design may be converted into a VHDL description such that the VHDL description utilizes logical attributes assigned to each physical attribute of the component. In FIG. 4, VHDL component data 430 includes SCM data 432 comprising VHDL information corresponding to SCM components of the design, MCM data 434 comprising VHDL information corresponding to MCM components of the design, card data 436 comprising VHDL information corresponding to different card components of the design, and board data 438 comprising VHDL information corresponding to system board or backplane components of the design. It should be understood that the VHDL content may vary depending on the components included in the design.

In FIG. 4, memory 414 also includes simulation model data 440. Simulation model data 440 may comprise information corresponding to a VHDL-based electronic circuit design model to be simulated and analyzed to extract odd or incorrect nets. In FIG. 4, model data 440 includes a VHDL model 442 which may represent an electronic circuit design, such as design 300, in VHDL. For example, build module 420 may be used to create VHDL model 442 using various VHDL representations of the physical components as represented by VHDL component data 430. During the model build process, the packaging data of each component is converted into a VHDL representation. The VHDL representation uses the logical netname for connections. The model build generally starts from a "bottom up" direction (e.g., from chips up to backplanes). The lowest level component, referred to as baselevel part, is connected to the next upper one and so forth. In some embodiments, the logical netnames may follow a naming convention. For each design component, a VHDL is processed out of the packaging data which now uses logical netnames instead of physical netnames. From the model build process, build module 420 may also generate a netlist 444 corresponding to VHDL model 442. A netlist generally conveys connectivity information and provides instances, nets, and perhaps some attributes of the connection. The netlist contains all nets by their logical name and the netwidth such as, for example, the following:

SC0.NC_A01_CP4_SC_CLK0_DAT 16 X
    SC0.NC_A01_CP0_SC_CLK4_DAT 16 X
    SC0.NC_A01_SC_FP0_CLK3_DAT 16 X
    SC0.NC_A01_SC_CP3_CLK1_DAT 16 X
    SC0.NC_A01_SC_CP4_CLK3_DAT 16 X

In some embodiments, VHDL model 442 may comprise a multivalue model supporting logic 0, 1, H, L and X states for bidirectional nets.

In the embodiment illustrated in FIG. 4, simulation model data 440 also includes a driving/monitoring or snoop VHDL 446 code. In some embodiments, snoop VHDL: 446 comprises two inferred latches: a "SET" latch and a "GET" latch. During simulation of VHDL model 442, either latch is recalculated in any simulation cycle. Snoop VHDL 446 is configured to accept different driving levels and to self-reset. For example, snoop VHDL 446 includes a self-resetting SET latch, a GET latch, and bidirectional input/output (IO). FIG. 5 illustrates an exemplary software code description of snoop VHDL 446.

Build module 420 is used to modify the VHDL content of the endpoint components of VHDL model 442 using snoop VHDL 446. For example, the original VHDL architecture content of the endpoint component VHDLs have an entity section and an architecture section. Build module 420 is used to replace the architecture section of the VHDL content of the endpoint components of VHDL model 442 so that each IO in a portmap of the endpoint component is connected to an instance of snoop VHDL 446. This enables the generation a fully populated VHDL model with known endpoint component netnames for stimulation and expectation purposes. The structural VHDLs describing the wiring/connections are unchanged. Build module 420 thereafter generates a snoop VHDL netlist 448 for VHDL model 442 containing the snoop VHDL 446 instances connected to IOs of the endpoint components of the circuit design. As an example, netlist 448 for VHDL model 442 may contain entries such as:

CP2.CP.ββ_P_C4_CP_PP_SC0_CLK3_CLOCK_N.GET 1 X
    CP2.CP.ββ_P_C4_CP_PP_SC0_CLK3_CLOCK_N.SET 1 X
    CP2.CP.ββ_P_C4_CP_PP_SC0_CLK3_CLOCK_P.GET 1 X
    CP2.CP.ββ_P_C4_CP_PP_SC0_CLK3_CLOCK_P.SET 1 X
    CP2.CP.ββ_P_C4_CP_PP_SC0_CLK3_DAT_0.GET 1 X
    CP2.CP.ββ_P_C4_CP_PP_SC0_CLK3_DAT_0.SET 1 X
    CP1.CP.ββ_P_C4_CP_PP_SC0_CLK3_DAT_1.GET 1 X
    CP1.CP.ββ_P_C4_CP_PP_SC0_CLK3_DAT_1.SET 1 X

Thus, in operation, each IO of an endpoint component is assigned to an instance of snoop VHDL 446. In VHDL, all identifiers are unique. Thus, as illustrated above, the snoop VHDL 446 instance name is chosen to have a prefix (e.g., "BB") followed by the original netname. As a further example, FIG. 6 illustrates an exemplary software code description of a snoop VHDL 446 modification for a chip identified as "ep_zchip."

Simulation module 422 is used for executing a simulation on VHDL model 442 utilizing the endpoint components with base VHDLs having the snoop VHDL 446 instances instead of their original VHDL architecture content. As illustrated above, snoop VHDL netlist 448 contains nets ending with GET or SET at the endpoints, and nets without either SET/GET representing the interconnection signals. In operation, simulation module 422 is used such that endpoints that end with ".SET" are stimulated while endpoints that end with ".GET" are observed. The SET latch of snoop VHDL 446 is driven to logical value 1 while the GET latch of snoop VHDL 446 is wired to the SET latch and to the output of the endpoint component VHDL. Since the clock signal in snoop VHDL 446's sensitivity list is always logical value 1, this part of the model is recalculated in each clock cycle without any further effort. Thus, upon the initiation of a simulation by simulation module 422, the first clock cycle puts/sets all ".SET" nets to logical value 1, and also all ".GET" nets will be a logical value 1, so the simulation model 442 does not have any logical 0 values.

Simulation module 422 executes the simulation of VHDL module 442 by driving a particular logical value to nets ending with SET and observing nets ending with GET. For example, in operation, simulation module 422 picks up or selects one net at a time and sticks the selected net to logical value 0 for one simulation cycle, checks all GET nets, and then unsticks the selected net. Simulation module 422 observes all GET nets for a simulation clash (e.g., being an "X" state since a logical 0 is driven against a logical 1). Any nets having an X state therefore belong to the same net. Any X state will disappear by unsticking the net and running one simulation clock cycle. So a net is identified for just one clock cycle and is separated from the next net simulation by another simulation clock cycle. FIG. 7 illustrates an exemplary software code description of a test case series of net simulation cycles performed by simulation module 422 for sequentially stimulating enpoint VHDL nets of the model.

As illustrated in FIG. 4, memory 414 also includes simulation data 450 containing information associated with the simulation performed by simulation module 422. For example, in some embodiments, any net which has an X state is reported by simulation module 422 into a simulation log 452. In some embodiments, simulation log 452 will contain entries identifying nets with X states based on a particular simulation clock cycle (e.g., identified on a per-simulation clock cycle basis). For example, simulation log 452 may include entries such as:
EXPECT:
  'CP2.CP.ββ_P_C4_CP_PP_SC0_CLK3_CLOCK_N.GET'=1 X [@1]
ACTUAL:
  'CP2.CP.ββ_P_C4_CP_PP_SC0_CLK3_CLOCK_N.GET'=X X
EXPECT:
  'CP2.CP.ββ_P_C4_CP_PP_SC0_CLK3_CLOCK_P.ET'=1 X [@1]
ACTUAL:
  'CP2.CP.ββ_P_C4_CP_PP_SC0_CLK3_CLOCK_P.GET'=X X The above simulation log 452 entries indicate that at clock cycle "@1," there are two nets connected:
  'CP2.CP.ββ_P_C4_CP_PP_SC0_CLK3_CLOCK_N.GET'=X
  'CP2.CP.ββ_P_C4_CP_PP_SC0_CLK3_CLOCK_P.GET'=X Thus, by executing the simulation as described above, connections or nets are retrieved by detecting simulation clashes for each simulation clock cycle.

In some embodiments, simulation module 422 analyzes and/or otherwise filters simulation log 452 to derive an odd net list 454. For example, simulation log 452 may include some nets which odd names or different names at the package/component connection and will generally show up within one clock cycle. Simulation module 422 may be configured to apply one or more rules to extract odd nets from simulation log 452. For example, in some embodiments, simulation module 422 filters simulation log 452 based on the center-string of a netname and its index. If these do not match, the net is written to odd net list 454.

Figure 8:
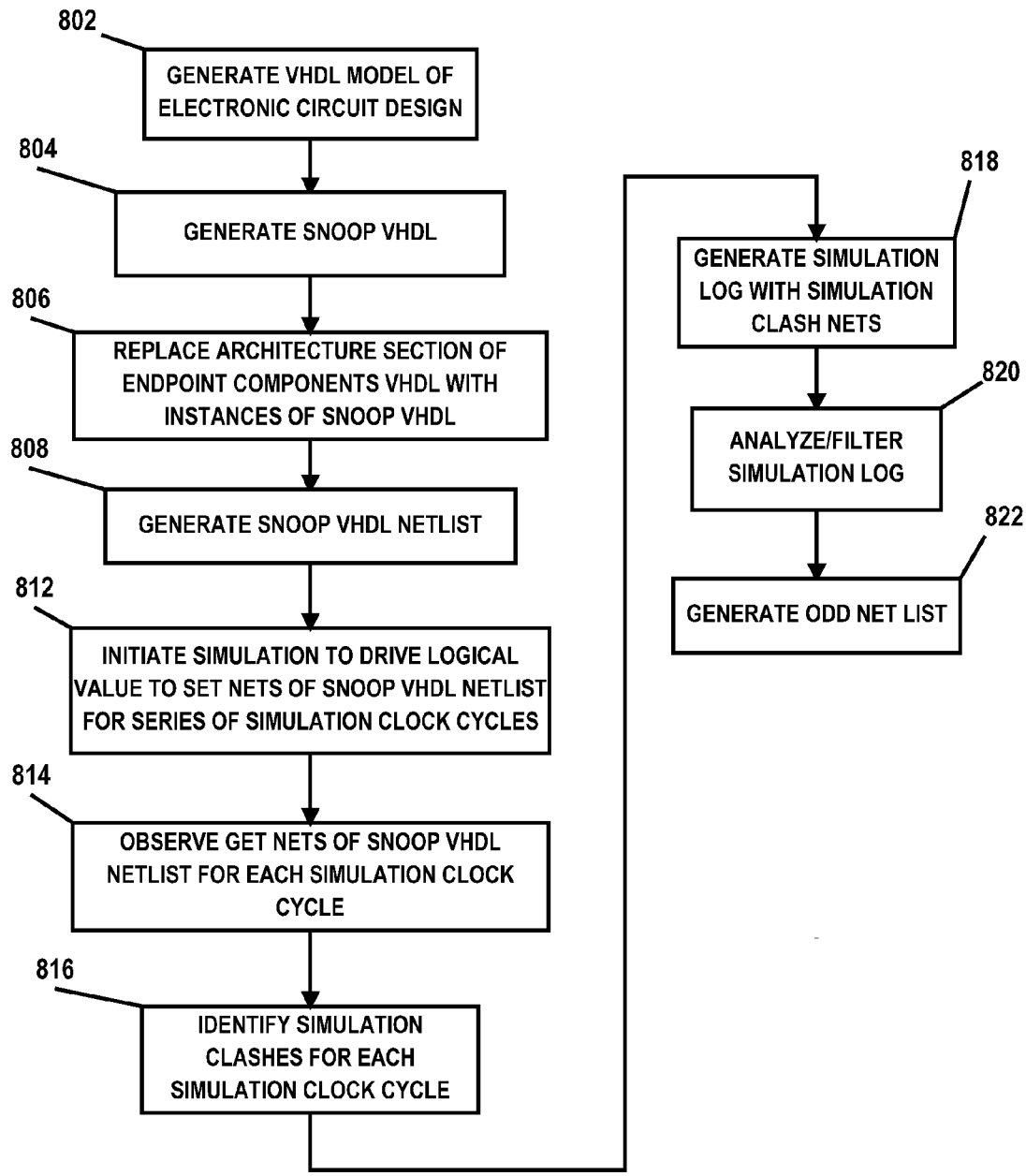
FIG. 8 is a flow diagram illustrating an embodiment of a method for identifying odd nets in a hierarchical electronic circuit design.

FIG. 8 is a flow diagram illustrating an embodiment of a method for identifying odd nets in a hierarchical electronic circuit design. The method begins at block 802, where build module 420 is used to generate VHDL model 442 of an electronic circuit design. At block 804, build module 420 creates and/or otherwise generates snoop VHDL 446. At block 806, build module 420 replaces the architecture section of the VHDL content of each endpoint component of the electronic circuit design represented by VHDL model 442 with instances of snoop VHDL 446.

At block 808, build module 420 generates snoop VHDL netlist 448 containing nets ending in SET and GET based on the modification of endpoint component VHDLs with snoop VHDL 446. At block 812, simulation module 422 receives the VHDL model 442 netlist 448 and initiates a simulation by sequentially selecting SET nets and driving a logical value 0. At block 814, simulation module 422 observes the GET nets for each simulation clock cycle to determine the logical value thereon. At block 816, simulation module 420 identifies simulation clashes for each simulation clock cycle based on an X state resulting from the logical 0 being driven against a logical value 1 on the GET nets. At block 818, simulation module 422 generates simulation log 452 identifying simulation clashes based on simulation clock cycles. At block 820, simulation module 422 analyzes and/or otherwise filters the content of simulation log 452 (e.g., based on applying a rule based on differing netnames). At block 822, simulation module 422 generates odd net list 454 corresponding to actual or potential odd or incorrect nets.

Thus, embodiments of the present disclosure enable odd nets to be identified in a hierarchical design package. For example, design validation over multiple packaging levels is typically performed by manual inspection. Embodiments of the present invention build a model of the design package containing all components of the package. Utilizing a snoop VHDL element, simulation clashes are detected based on a logical value 1 being driven against a logical value 0. The simulation clashes are used to identify nets extending across, over or through different levels of the design hierarchy. The identified nets based on the simulation clashes may then be analyzed for incorrect or odd nets.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A computer-implemented method for identifying odd nets in a hierarchical electronic circuit design, comprising:
  receiving a very high-speed integrated circuit hardware description language (VHDL) model of an electronic circuit design;
  modifying an architecture section of VHDL code of each endpoint component of the VHDL model to connect each input/output (IO) of each endpoint component to an instance of a snoop VHDL code;
  executing a simulation of the VHDL model through a plurality of clock cycles while driving a logical value by the snoop VHDL code and deriving simulation clashes detected by the snoop VHDL code for each IO of the endpoint components; and
  extracting an odd net topology for the VHDL model based on the simulation clashes derived from the simulation.

2. The method of claim 1, further comprising configuring the snoop VHDL code comprising a first latch and a second latch.

3. The method of claim 2, further comprising driving the logical value by the first latch and detecting simulation clashes by the second latch.

4. The method of claim 3, further comprising configuring the first latch of the snoop VHDL code as a self-resetting latch.

5. The method of claim 1, wherein executing the simulation comprises:
  selecting a first IO of a first endpoint component;
  driving the logical value by a first latch of the snoop VHDL code connected to the first IO for a clock cycle;
  detecting a logical value by a second latch of the snoop VHDL code connected to the first JO for the clock cycle; and
  identifying a difference between the driven logical value and the detected logical value as a simulation clash.

6. The method of claim 1, further comprising generating a simulation net list indicating nets for each cycle of the executed simulation.

7. The method of claim 6, further comprising filtering the simulation net list based on logical netnames of the VHDL model.

8. A system for identifying odd nets in a hierarchical electronic circuit design, comprising:
  a processor unit;
  a build module executable by the processor unit for receiving a very high-speed integrated circuit hardware description language (VHDL) model of an electronic circuit design, the build module operable to modify an architecture section of VHDL code of each endpoint component of the VHDL model to connect each input/output (TO) of each endpoint component to an instance of a snoop VHDL code; and
  a simulation module for executing a simulation of the VHDL model through a plurality of clock cycles while driving a logical value by the snoop VHDL code and deriving simulation clashes detected by the snoop VHDL code for each JO of the endpoint components, the simulation module operable to extract an odd net topology for the VHDL model based on the simulation clashes derived from the simulation.

9. The system of claim 8, wherein the snoop VHDL code comprises a first latch and a second latch.

10. The system of claim 9, wherein the simulation module is operable to drive the logical value by the first latch and detect simulation clashes by the second latch.

11. The system of claim 10, wherein the first latch of the snoop VHDL code comprises a self-resetting latch.

12. The system of claim 8, wherein the simulation module is operable to:
  select a first IO of a first endpoint component;
  drive the logical value by a first latch of the snoop VHDL code connected to the first IO for a clock cycle;
  detect a logical value by a second latch of the snoop VHDL code connected to the first IO for the clock cycle; and
  identify a difference between the driven logical value and the detected logical value as a simulation clash.

13. The system of claim 8, wherein the simulation module is operable to generate a simulation net list indicating nets for each cycle of the executed simulation.

14. The system of claim 13, wherein the simulation module is operable to filter the simulation net list based on logical netnames of the VHDL model.

15. A computer program product for identifying odd nets in a hierarchical electronic circuit design, the computer program product comprising:
  a non-transitory computer readable medium having computer readable program code embodied therewith, the computer readable program code comprising computer readable program code configured to:
    receive a very high-speed integrated circuit hardware description language (VHDL) model of an electronic circuit design;
    modify an architecture section of VHDL code of each endpoint component of the VHDL model to connect each input/output (IO) of each endpoint component to an instance of a snoop VHDL code;
    execute a simulation of the VHDL model through a plurality of clock cycles while driving a logical value by the snoop VHDL code and deriving simulation clashes detected by the snoop VHDL code for each IO of the endpoint components; and
    extract an odd net topology for the VHDL model based on the simulation clashes derived from the simulation.

16. The computer program product of claim 15, wherein the computer readable program code is configured to drive the logical value by a first latch of the snoop VHDL code and detect simulation clashes by a second latch of the snoop VHDL code.

17. The computer program product of claim 15, wherein the computer readable program code is configured to:
  select a first IO of a first endpoint component;
  drive the logical value by a first latch of the snoop VHDL code connected to the first IO for a clock cycle;
  detect a logical value by a second latch of the snoop VHDL code connected to the first IO for the clock cycle; and identify a difference between the driven logical value and the detected logical value as a simulation clash.

18. The computer program product of claim 15, wherein the computer readable program code is configured to generate a simulation net list indicating nets for each cycle of the executed simulation.

19. The computer program product of claim 18, wherein the computer readable program code is configured to filter the simulation net list based on logical netnames of the VHDL model.

\* \* \* \* \*